(12) United States Patent
Jeffers et al.

(10) Patent No.: US 11,893,917 B2
(45) Date of Patent: Feb. 6, 2024

(54) APPARATUS AND METHOD FOR MODULATING LIGHT OUTPUT USING A DISPLAY

(71) Applicant: Nokia Technologies Oy, Espoo (FI)

(72) Inventors: Nicholas Jeffers, Wicklow (IE); Ian Davis, Wicklow (IE); Akshat Agarwal, Clonmagadden (IE); Diarmuid O'Connell, Athy (IE); Oliver Burns, County Meath (IE)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 18/016,007

(22) PCT Filed: Jun. 22, 2021

(86) PCT No.: PCT/EP2021/066966
§ 371 (c)(1),
(2) Date: Jan. 13, 2023

(87) PCT Pub. No.: WO2022/017710
PCT Pub. Date: Jan. 27, 2022

(65) Prior Publication Data
US 2023/0186808 A1    Jun. 15, 2023

(30) Foreign Application Priority Data

Jul. 20, 2020 (EP) .................................. 20186765

(51) Int. Cl.
*G09G 3/00* (2006.01)
*G06F 1/16* (2006.01)
*G09G 3/06* (2006.01)

(52) U.S. Cl.
CPC ............. *G09G 3/03* (2020.08); *G06F 1/1616* (2013.01); *G06F 1/1647* (2013.01); *G09G 3/06* (2013.01); *G09G 2310/02* (2013.01); *G09G 2320/0626* (2013.01)

(58) Field of Classification Search
CPC .......... G09G 3/03; G09G 3/06; G06F 1/1616; G06F 1/1647
USPC .................................................... 345/55, 426
See application file for complete search history.

(56) References Cited

U.S. PATENT DOCUMENTS

| | | | |
|---|---|---|---|
| 2016/0196685 A1* | 7/2016 | Segasby | G06T 19/20 345/426 |
| 2016/0363291 A1 | 12/2016 | Sun | |
| 2017/0269742 A1* | 9/2017 | Arola | G02B 5/0263 |
| 2018/0188579 A1* | 7/2018 | Jeong | G02F 1/133345 |
| 2018/0239574 A1* | 8/2018 | Koziol | G06F 3/1423 |
| 2018/0293752 A1* | 10/2018 | Ninan | G02B 30/24 |
| 2022/0075199 A1* | 3/2022 | Trisnadi | G02B 27/62 |

FOREIGN PATENT DOCUMENTS

EP        3343274 A2    7/2018

* cited by examiner

*Primary Examiner* — Prabodh M Dharia
(74) *Attorney, Agent, or Firm* — Harrington & Smith

(57) ABSTRACT

An apparatus and method is provided including: modulating or modifying light output by one or more light sources, wherein the light output is for use in rendering content in a first direction using a display, wherein the display has at least one curved portion, wherein the modulating or modifying of the light output by the one or more light sources modulates or modifies said light within said at least one curved portion such that said content is rendered in the first direction.

16 Claims, 6 Drawing Sheets

APPARATUS AND METHOD FOR MODULATING LIGHT OUTPUT USING A DISPLAY

CROSS REFERENCE TO RELATED APPLICATION

This patent application is a U.S. National Stage application of International Patent Application Number PCT/EP2021/066966 filed Jun. 22, 2021, which is hereby incorporated by reference in its entirety, and claims priority to EP 20186765.2 filed Jul. 20, 2020.

FIELD

The present specification relates to displays of devices, such as mobile communication devices.

BACKGROUND

Many device displays exists. There remains a need for further developments in this field.

SUMMARY

In a first aspect, this specification describes an apparatus comprising means for performing: modulating or modifying light output by one or more light sources (e.g. a plurality of light sources), wherein the light output is for use in rendering content in a first direction using a display of the apparatus, wherein the display has at least one curved portion, wherein the modulating or modifying of the light output by the one or more light sources modulates or modifies said light within said at least one curved portion such that said content is rendered in the first direction within said curved portion. The first direction may be substantially perpendicular to the display.

In some example embodiments, at least one of said at least one curved portion is at a periphery of the apparatus. The said modulating or modifying of the light output by the light source may be such that said content is rendered in the first direction within the curved periphery of the apparatus.

The means for modulating or modifying light output by the one or more light sources may be configured to attenuate light in directions other than the first direction. The attenuation may be complete (e.g. 100% attenuation) such that the light is removed is the directions others than the first direction. In other embodiments, the removal may be partial.

The means for modulating or modifying the light output may comprise an absorbing diffuser.

The means for modulating or modifying the light output may comprise an anisotropic diffusor.

The apparatus may further comprise means for performing: increasing light intensity of light output within the or each curved portion of the display to compensate for modulating or modifying the light output within the curved portion.

The apparatus may further comprise means for performing: coupling (e.g. connecting) the display of the apparatus to one or more displays of another apparatus, such as one or more displays of each of a plurality of other apparatus. The said means for coupling/connecting may comprise a magnetic coupling means and/or a hinge means.

In some example embodiments, the display is a foldable display comprising a first portion and a second portion, such that an angle between the first and second portions is changeable.

The said means may comprise: at least one processor; and at least one memory including computer program code, the at least one memory and the computer program configured, with the at least one processor, to cause the performance of the apparatus.

In a second aspect, this specification describes a method comprising: modulating or modifying light output by one or more light sources (e.g. a plurality of light sources), wherein the light output is for use in rendering content in a first direction using a display, wherein the display has at least one curved portion, wherein the modulating or modifying of the light output by the one or more light sources modulates or modifies said light within said at least one curved portion such that said content is rendered in the first direction within said curved portion. The first direction may be substantially perpendicular to the display.

At least one of said at least one curved portion may be at a periphery of the display, wherein the modulating or modifying of the light output by the light source is such that said content is rendered in the first direction within the curved periphery of the display.

In some example embodiments, modulating or modifying the light output by the one or more light sources comprises attenuating light in directions other than the first direction. The attenuation may be complete (e.g. 100% attenuation) such that the light is removed is the directions others than the first direction.

The method may further comprise increasing light intensity of light output within the or each curved portion of the display to compensate for modulating or modifying the light output within the curved portion.

The method may further comprise: coupling (e.g. connecting) the display of the apparatus to one or more displays of another apparatus, such as one or more displays of each of a plurality of other apparatus. The said means for couling/connecting may comprise a magnetic coupling means and/or a hinge means.

The display may be a foldable display comprising a first portion and a second portion, such that an angle between the first and second portions is changeable.

In a third aspect, this specification describes computer-readable instructions which, when executed by computing apparatus, cause the computing apparatus to perform (at least) any method as described with reference to the second aspect.

In a fourth aspect, this specification describes a computer-readable medium (such as a non-transitory computer-readable medium) comprising program instructions stored thereon for performing (at least) any method as described with reference to the second aspect.

BRIEF DESCRIPTION OF THE DRAWINGS

Example embodiments will now be described, by way of example only, with reference to the following schematic drawings, in which.

DETAILED DESCRIPTION

Figure 1:
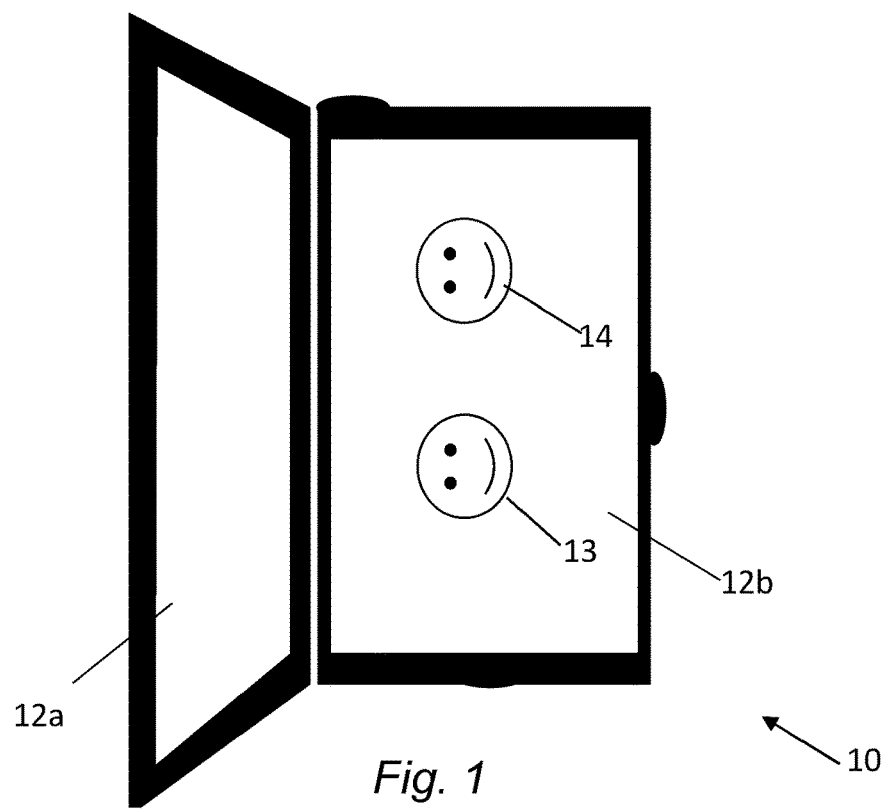
FIGS. 1 and 2 are block diagrams of user devices in accordance with example embodiments.

The scope of protection sought for various embodiments of the invention is set out by the independent claims. The embodiments and features, if any, described in the specification that do not fall under the scope of the independent claims are to be interpreted as examples useful for understanding various embodiments of the invention.

In the description and drawings, like reference numerals refer to like elements throughout.

FIG. 1 is a block diagram of a user device 10, in accordance with an example embodiment. The user device 10 may, for example, be a mobile communication device, a laptop or some other device having a display.

The user device 10 comprises a first display 12a and a second display 12b. In the configuration shown in FIG. 1, the first display 12a is folded relative to the second display 12b. The folding of the first display 12a has the effect of partially closing the overall display of the user device 10. In response to this partial closing, a display output (comprising a first face 13 and a second face 14) is provided on the second display 12b only.

Figure 2:
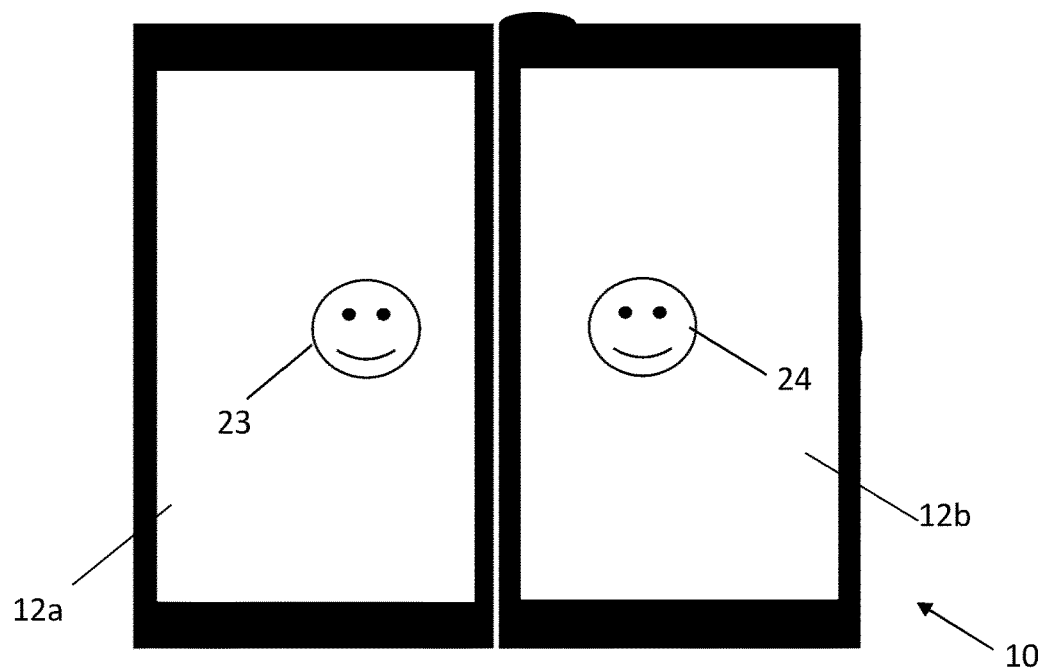

FIG. 2 is a block diagram of the user device 10 in accordance with an example embodiment. In the configuration shown in FIG. 1, the displays of the user device 10 are flat, such that the first and second displays 12a and 12b are operable as a single display. Thus, in the configuration shown in FIG. 2, the example user device 10 provides a single display output including a first face 23 and a second face 24 that are displayed across the first and second displays 12a and 12b.

The first and second displays 12a and 12b are separate displays, such that a visual break or line appears between the two screens. The user device 10 is not able to provide a seamless, continuous screen with the reliability of having two or more screens and conventional reliable hinge(s) or similar coupling mechanism.

Figure 3:
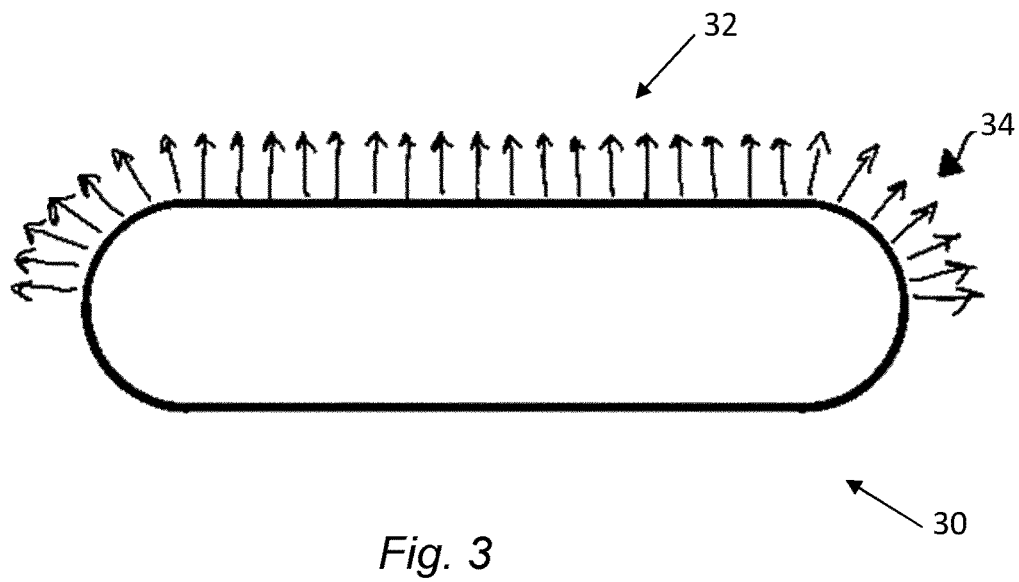
FIG. 3 is a schematic cross section of a user device in accordance with an example embodiment.

FIG. 3 is a schematic cross section of a user device, indicated generally by the reference numeral 30, in accordance with an example embodiment. The user device 30 may, for example, be a mobile communication device, a laptop or some other device having a display.

The user device 30 comprise one or more light sources for use in rendering content in a first direction using a display of the user device 30. For most of the area of the display of the user device, content is rendered in a first direction 32 generally perpendicular to the display. As shown in FIG. 3, the display is curved towards a periphery of the user device 30. Light sources provided within the user device 30 (such as the light source 40 described below) follow the shape of the exterior of the user device; accordingly, the direction of light output by the display is generally in a direction perpendicular to the local exterior surface of the display (e.g. the directions 34 shown in FIG. 3).

Figure 4:
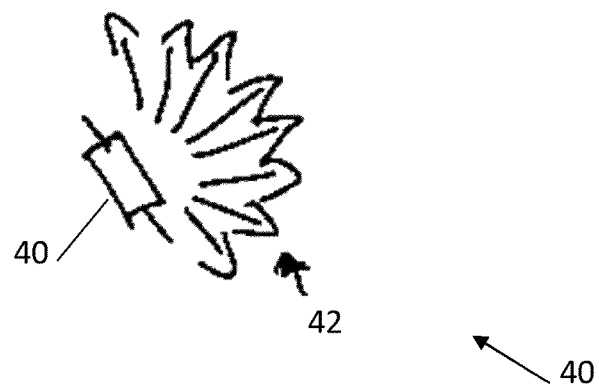
FIG. 4 shows a light source in accordance with an example embodiment.

FIG. 4 shows a light source, indicated generally by the reference numeral 40, in accordance with an example embodiment. The light source 40 outputs light is multiple directions, as indicated by the light outputs 42 (indeed, the light source 40 may be substantially omnidirectional). The user device 30 may have a plurality of light sources 40.

Figure 5:
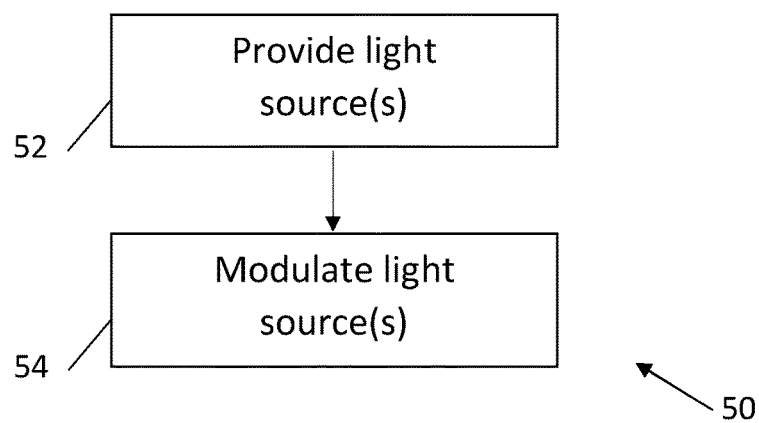
FIG. 5 is a flow chart showing an algorithm in accordance with an example embodiment.

FIG. 5 is a flow chart showing an algorithm, indicated generally by the reference numeral 50, in accordance with an example embodiment.

The algorithm 50 starts at operation 52 where one or more light sources (such as light sources 40) are provided for use in rendering content in a first direction using a display (such as the display of the user device 30). The display may be curved towards a periphery (such as the user device 30) or curved elsewhere.

At operation 54, the light output in the vicinity of the curved edge is modified or modulated such that content is rendered in the first direction in the vicinity of the curved area (e.g. the curved periphery). Thus, for example, light output generally in the directions 34 described above may be modified or modulated to be provided in the direction 32.

Figure 6:
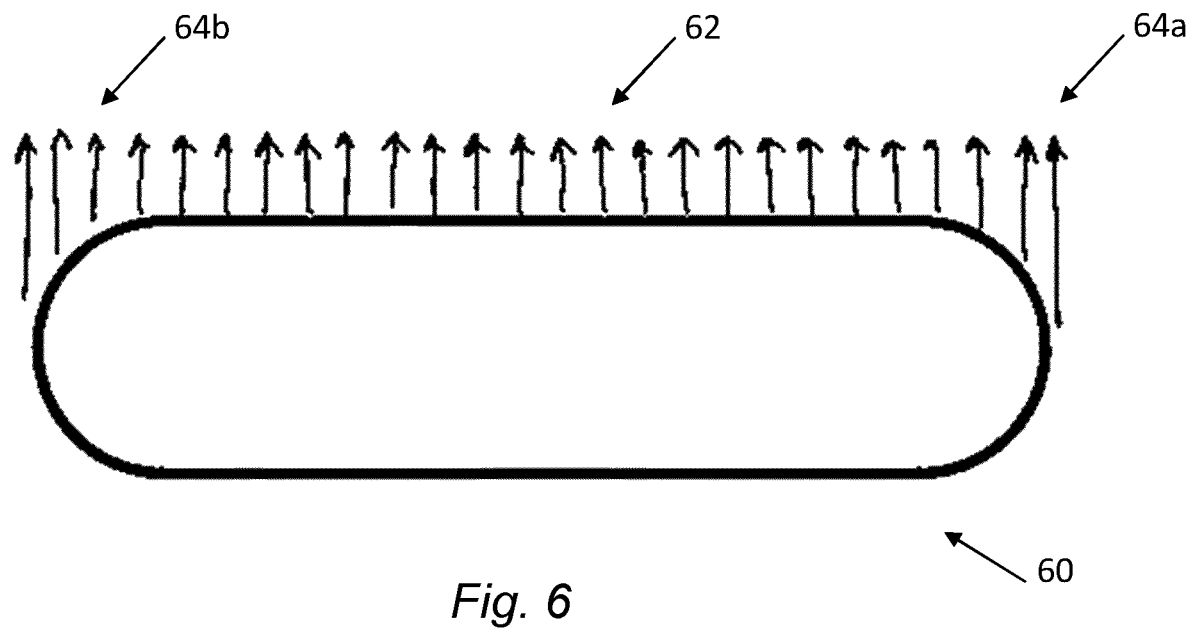
FIG. 6 is a schematic cross section of a user device in accordance with an example embodiment.

FIG. 6 is a schematic cross section of a user device, indicated generally by the reference numeral 60, in accordance with an example embodiment. The light output by the user device has been modified or modulated (as described above in the operation 54 of the algorithm so) such that light is output in a direction substantially perpendicular to the display.

Thus, for most of the area of the display of the user device 60, content is rendered in a first direction 62 generally perpendicular to the display (similar to the direction 32 of the user device 30 described above). Towards a first curved periphery of the user device 60, content is rendered in directions substantially parallel to the first direction 62, as discussed further below.

In the user device 60, a plurality of light sources are provided, providing a plurality of light beam outputs (as shown in FIG. 6). The light sources may take many forms. For example, omnidirectional light sources, or light sources having at least many directions of light emittance may be used (such as the light source 40 described above).

As described further below, the operation 54 of the algorithm 50 may be configured to remove or attenuate light in directions other than the first direction 62. Thus, for example, horizontal components of light at the periphery of the user device may be removed.

The operation 54 may be implemented using a diffuser or similar device around the periphery of the device to give the illusion that the display goes right to the edge. In this way, a bevel distortion at the edge of many displays can be removed. As shown in FIG. 6, the display of the user device 6o wraps around the corner of the device (at the curved sections) and modulating diffusing elements can be used to redirect the light (in the regions 64a and 64b) so that it gives the user the illusion that the display goes right to the edge.

An input image for display may be geometrically adapted to compensate for any optical distortion problems. This may allow two or more displays to be positioned beside one another without the perception of a break or line between the displays. As a result, dual, triple, or quadruple displays beside each other appear like a single display.

Figure 7:
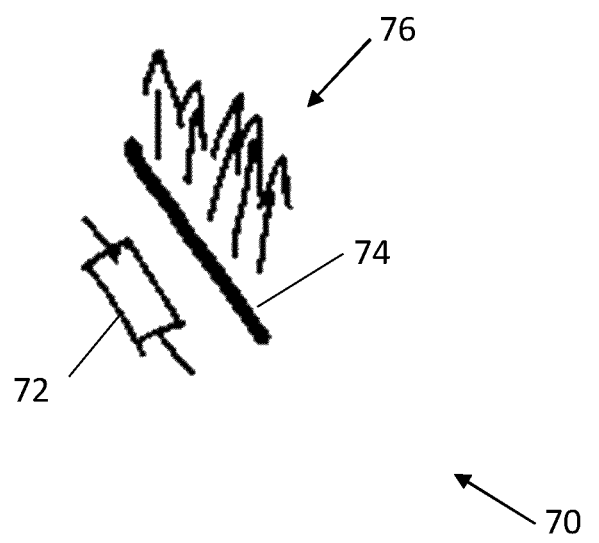
FIG. 7 shows a light source system in accordance with an example embodiment.

FIG. 7 shows a light source system, indicated generally by the reference numeral 70, in accordance with an example embodiment. The light source system 70 comprises a light source 72 and a diffuser 74. The light source 72 may be the same as the light source 40 described above.

A number of diffusers could be used in the light source system 70. For example, the diffuser 74 may be an absorbing diffuser (in which light in unwanted direction is removed) or an anisotrpic diffuser (e.g. a diffuser having a small output angle).

Figure 8:
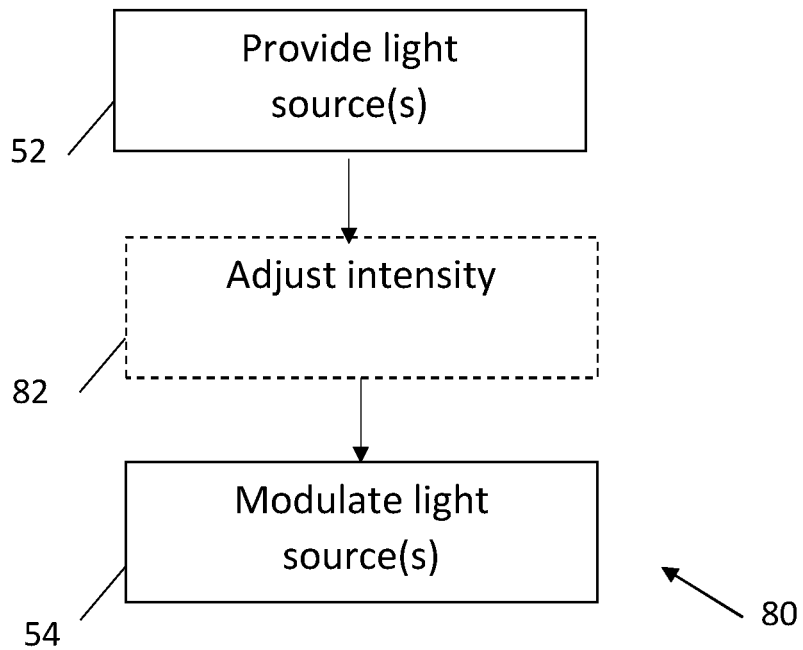
FIGS. 8 and 9 are flow charts showing algorithms in accordance with example embodiments.

FIG. 8 is a flow chart showing an algorithm, indicated generally by the reference numeral 80, in accordance with an example embodiment.

The algorithm 80 starts with the operation 52 described above, wherein one or more light sources are provided for use in rendering content in a first direction using a display (such as the display of the user device 60). The displays may be curved towards a periphery.

At operation 82, light intensity is adjusted. The operation 82 may include increasing light intensity of light output near the curved periphery to compensate for modulating the light output in the vicinity of the curved periphery. (The operation 82 is dotted in FIG. 8, since that operation may be omitted in some example embodiments.)

At operation 54, the light output in the vicinity of the curved portion (e.g. a curved edge) is modified or modulated such that content is rendered in the first direction in the vicinity of the curved region.

Thus, in some example embodiments, light at a curved periphery (or some other curved region) of a user device (such as in the regions 64a and 64b of the user device 60) is unmodulated, such that, for example, the light emits unidirectionally. An absorbing diffusor (such as the diffuser 74) can be provided to remove undesired light direction. Thus, in the region 62 of the user device 60, there may be no diffusion since the OLED (or any display) may emit unidirectionally ("Lambertian emitter") already. The amount of diffusion would increase along the curved surface so that light goes generally upwards too. However, light will diffuse in all directions so the intensity of the usable light going upward will decrease along the surface. This can be compensated for by modulating the luminance of the display (see the operation 82 described above). This will tend to increase the energy consumption and/or reduce the overall luminance of the display if the luminance of the flat sections is to be kept also in the curved section.

An alternative is to use modulated anisotropic diffusor with a small output angle, an illustration of which is shown in FIG. 7. Both diffusing cone direction and ellipticity can be controlled in order to, for example, diffuse only perpendicularly to the edge of a user device (such as the user device 60). This type of diffusor would modulate the light so that emits in the desired direction without the notable drop in intensity that would occur using conventional absorbing modulation as described above. Thus, the is operation 82 may be omitted.

Figure 9:
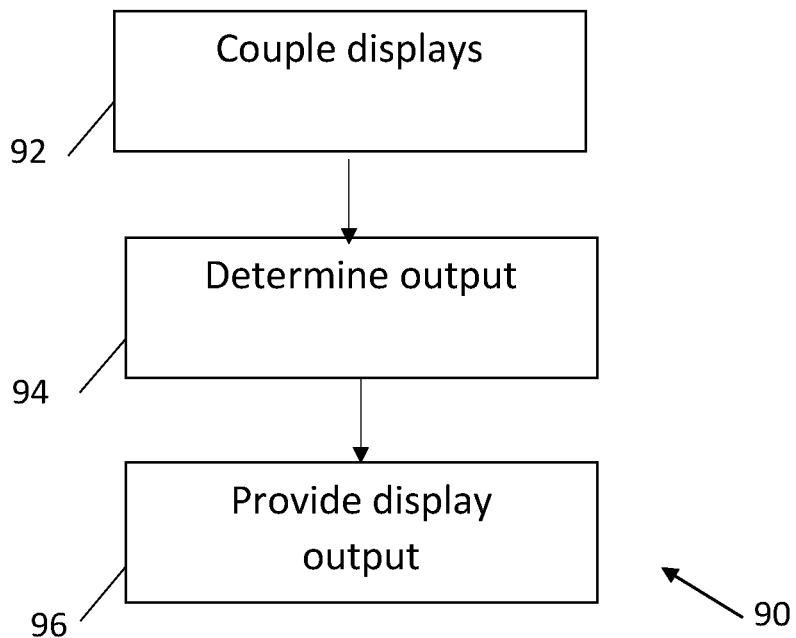

FIG. 9 is a flow chart showing an algorithm, indicated generally by the reference numeral 90, in accordance with an example embodiment.

The algorithm 90 starts at operation 92, where two out more displays are coupled together. At operation 94, an output to be displayed using a combined display of the coupled displayed is determined. Finally, at operation 96, the display determined in operation 94 is provided to the coupled display. In this way, multiple displays that are coupled together (in the operation 92) can be used to a single display.

Displays may be coupled together in many different ways. A number of example implementations of the operation 92 are discussed below. Of course the skilled person will be aware of other potential coupling configurations that could be provided.

Figure 10:
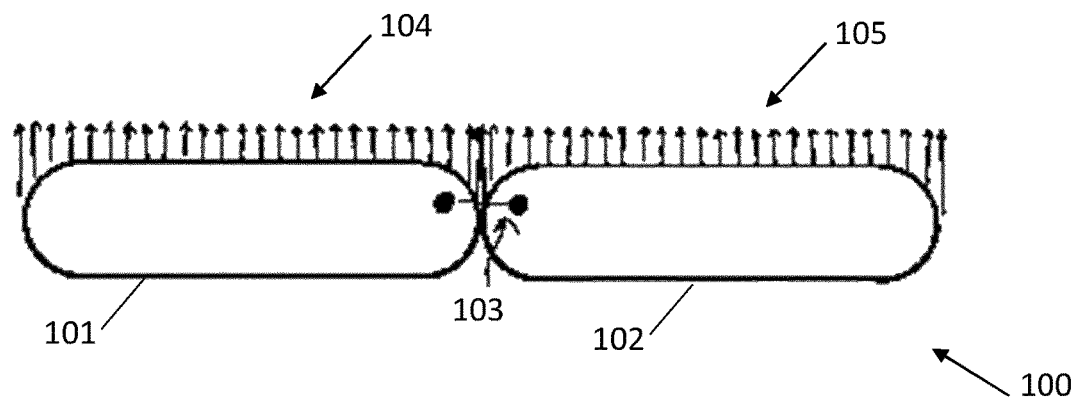
FIG. 10 is a schematic cross section of a user device in accordance with an example embodiment.

FIG. 10 is a schematic cross section of a user device, indicated generally by the reference numeral 100, in accordance with an example embodiment.

The user device 100 comprises a first display 101 and a second display 102, which displays are foldable using a hinge 103. The first display 101 has an output indicated generally by the reference numeral 104 and the second display has an output indicated generally by the reference numeral 105. As with the user device 60 described above, the displays 101 and 102 each have curved peripheries, with the light sources as the peripheries being modulated or modified such that the output across the first display 101 is provided in a single direction and the output across the second display 102 is provided in a single direction. With the displays folded flat as shown in FIG. 10, the first and second displays are orientated in the same direction such that the outputs 104 and 105 can be used to provide a single display.

Figure 11:
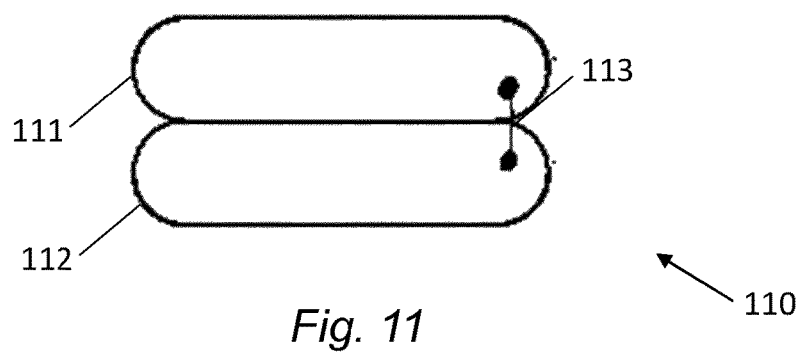
FIG. 11 is a bottom view of a user device in accordance with an example embodiment.

FIG. 11 is a bottom view of a user device, indicated generally by the reference numeral 110, in accordance with an example embodiment. Thus user device no comprise a first display in and a second display 112 coupled using a hinge 113. The user device no is therefore similar to the user device 100, differing only in the hinge position, which results in a different configuration of displays when the user device displays an unfolded.

The hinges 103 and 113 can be used to provide reliable mechanisms for providing the respective displays as foldable displays. Such displays may be reliable since they can be provided without being subject to tensile, compressive, or perpendicular stress. Moreover, displays can be provided such that the user can be provided with an unbroken large single screen consisting of displays from multiple user devices and/or multiple displays of the same user device.

Figure 12:
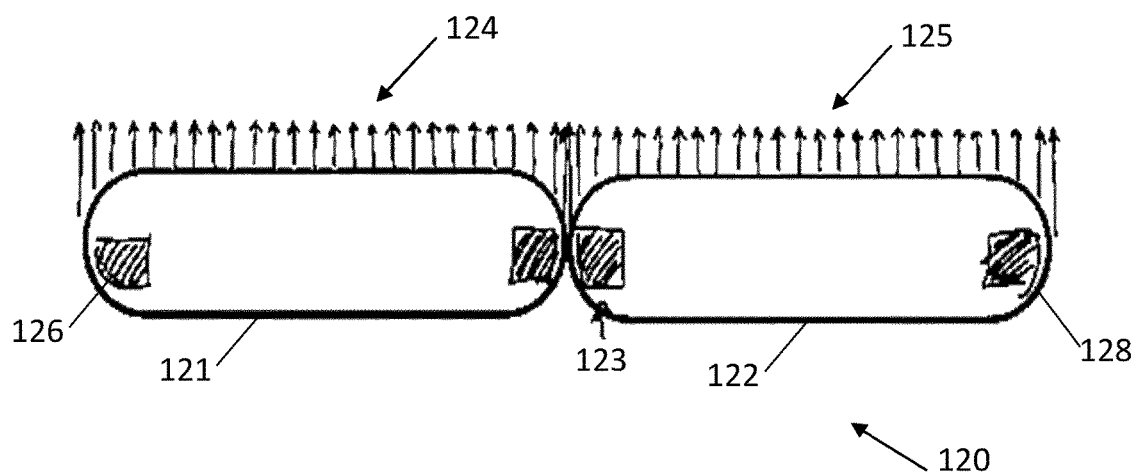
FIG. 12 is a schematic cross section of a system in accordance with an example embodiment.

FIG. 12 is a schematic cross section of a system, indicated generally by the reference numeral 120, in accordance with an example embodiment.

The system 120 comprises a first device 121 and a second device 122 that are coupled together using a magnetic coupling arrangement 123. The first device 121 has an output indicated generally by the reference numeral 124 and the second device 122 has an output indicated generally by the reference numeral 125.

The output provided by the system 120 is similar to the output provided by the user device 100. However, in the system 120, the first and second devices may be entirely separate devices, perhaps owned by different users.

The first device has an additional magnetic coupling arrangement 126 that can enable a further device to be magnetically coupled to the first device 121 (thereby extending the display further). The second device has a similar additional magnetic coupling 128.

Accordingly, the display provided by the system 120 can, in principle, be extended to include any number of similar devices. Coupling means could be provided on multiple sides of a user devices, such that a display can be extended in two-dimensions. Moreover, coupling means may be combined such that, for example, both magnetic coupling and hinge coupling is provided.

Figure 13:
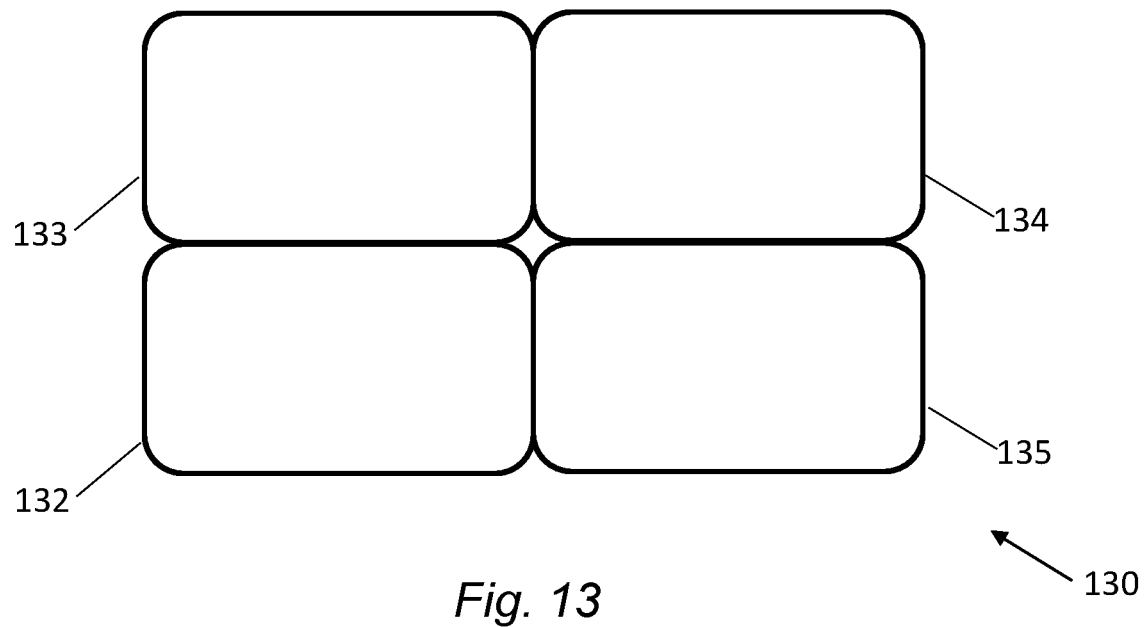
FIG. 13 is a plan view of a display in accordance with an example embodiment.

FIG. 13 is a plan view of a display, indicated generally by the reference numeral 130, in accordance with an example embodiment. The display 130 comprises the a first display 132 of a first device, a second display 133 of a second device, a third display 134 of a third device and a fourth display 135 of a fourth device. Coupling between the displays 132 to 135 may take many different forms (e.g. using hinges, magnetic couplings or some other coupling arrangement).

Figure 14:
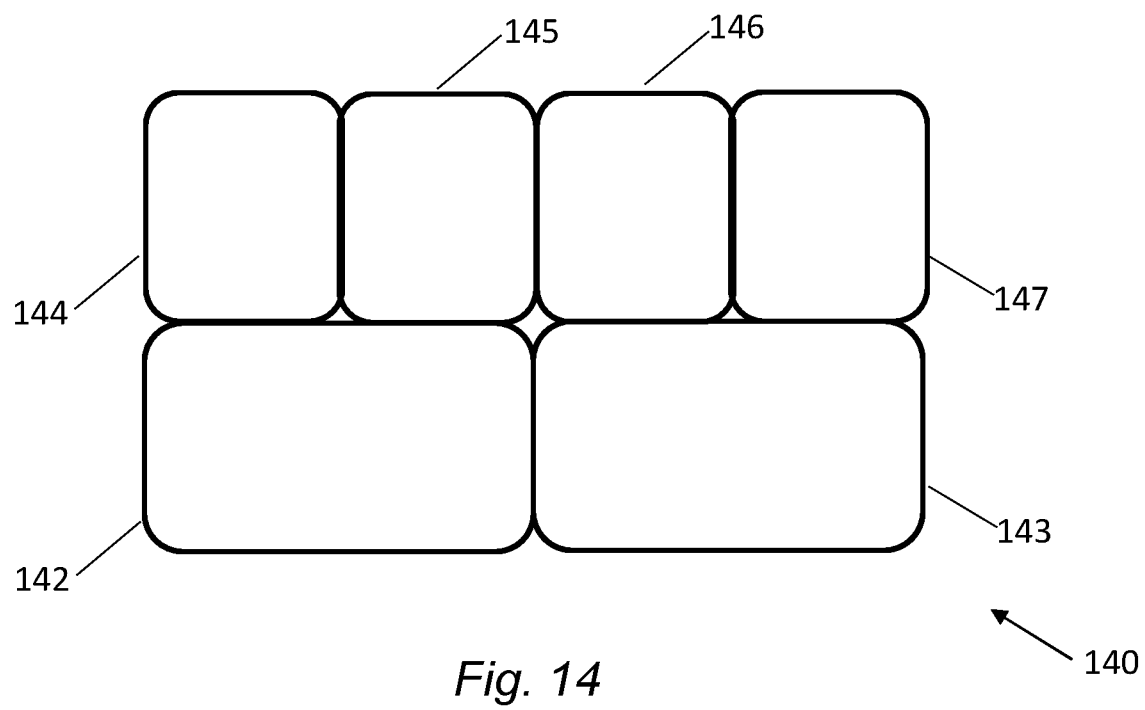
FIG. 14 is a plan view of a display in accordance with an example embodiment.

FIG. 14 is a plan view of a display, indicated generally by the reference numeral 140, in is accordance with an example embodiment. The display 140 comprises: a first display 142 of a first device; a second display 143 of a second device; a third display 144 and a fourth display 145 of a third device; and a fifth display 146 and a sixth display 147 of a fourth device. As shown in FIG. 14, the first display 142 is coupled to the second display 143, the third display 144 and the fourth display 145. The second display 143 is coupled to the first display 142, the fifth display 146 and the sixth display 147. The third display 144 is coupled to the first display 142 and the fourth display 145. The fourth display 145 is coupled to the first display 142, the third display 144 and the fifth display 146. The firth display is coupled to the second display 143, the fourth display 145 and the sixth display 147. The sixth display 147 is coupled to the second display 143 and the fifth display 146. Coupling between the displays 142 to 147 may take many different forms (e.g. using hinges, magnetic couplings or some other coupling arrangement).

The systems 130 and 140 enable multiple user devices (e.g. devices of different users) to be coupled together in many configurations to make a single display. For example, a large display could be constructed from multiple relatively small user devices displays, for example for providing a video conference display or a display for watching a movie.

Embodiments of the present invention may be implemented in software, hardware, application logic or a combination of software, hardware and application logic. The software, application logic and/or hardware may reside on memory, or any computer media. In an example embodiment, the application logic, software or an instruction set is maintained on any one of various conventional computer-readable media. In the context of this document, a "memory" or "computer-readable medium" may be any non-transitory media or means that can contain, store, communicate, propagate or transport the instructions for use by or in connection with an instruction execution system, apparatus, or device, such as a computer.

Reference to, where relevant, "computer-readable medium", "computer program product", "tangibly embodied computer program" etc., or a "processor" or "processing circuitry" etc. should be understood to encompass not only computers having differing architectures such as single/multi-processor architectures and sequencers/parallel architectures, but also specialised circuits such as field programmable gate arrays FPGA, application specify circuits ASIC, signal processing devices/apparatus and other devices/apparatus. References to computer program, instructions, code etc. should be understood to express software for a programmable processor firmware such as the programmable content of a hardware device/apparatus as instructions for a processor or configured or configuration settings for a fixed function device/apparatus, gate array, programmable logic device/apparatus, etc.

If desired, the different functions discussed herein may be performed in a different order and/or concurrently with each other. Furthermore, if desired, one or more of the above-described functions may be optional or may be combined. Similarly, it will also be appreciated that the flow diagrams of FIGS. 5, 8 and 9 are examples only and that various operations depicted therein may be omitted, reordered and/or combined.

It will be appreciated that the above described example embodiments are purely illustrative and are not limiting on the scope of the invention. Other variations and modifications will be apparent to persons skilled in the art upon reading the present specification.

Moreover, the disclosure of the present application should be understood to include any novel features or any novel combination of features either explicitly or implicitly disclosed herein or any generalization thereof and during the prosecution of the present application or of any application derived therefrom, new claims may be formulated to cover any such features and/or combination of such features.

Although various aspects of the invention are set out in the independent claims, other aspects of the invention comprise other combinations of features from the described example embodiments and/or the dependent claims with the features of the independent claims, and not solely the combinations explicitly set out in the claims.

It is also noted herein that while the above describes various examples, these descriptions should not be viewed in a limiting sense. Rather, there are several variations and modifications which may be made without departing from the scope of the present invention as defined in the appended claims.

The invention claimed is:

1. An apparatus, comprising:
at least one processor; and
at least one non-transitory memory storing instructions that, when executed with the at least one processor, cause the apparatus to perform:
modulating or modifying a light output with one or more, light sources, wherein the light output is for use in rendering content in a first direction using a display of the apparatus, wherein the display has at least one curved portion, wherein the modulating or modifying of the light output with the one or more light sources modulates or modifies said light within said at least one curved portion such that said content is rendered in the first direction within said curved portion.

2. An apparatus as claimed in claim 1, wherein said at least one curved portion is at a periphery of the apparatus, wherein the instructions, when executed with the at least one processor, cause the apparatus to render the content in the first direction within the curved periphery of the apparatus.

3. An apparatus as claimed in claim 1, wherein the instructions, when executed with the at least one processor, cause the apparatus to attenuate light in directions other than the first direction.

4. An apparatus as claimed in claim 1, wherein the one or more light sources comprises an absorbing diffuser.

5. An apparatus as claimed in claim 1, wherein the one or more light sources comprises an anisotropic diffusor.

6. An apparatus as claimed in claim 1, wherein the first direction is substantially perpendicular to the display.

7. An apparatus as claimed in claim 1, wherein the instructions, when executed with the at least one processor, cause the apparatus to increase light intensity of the light output within the or curved portion of the display to compensate for modulating or modifying the light output within the curved portion.

8. An apparatus as claimed in claim 1, wherein the instructions, when executed with the at least one processor, cause the apparatus to couple the display of the apparatus to one or more displays of another apparatus.

9. An apparatus as claimed in claim 8, wherein the instructions, when executed with the at least one processor, cause the apparatus to couple the display of the apparatus to one or more displays of a plurality of other apparatus.

10. An apparatus as claimed in claim 8, wherein the instructions, when executed with the at least one processor, cause the apparatus to at least one of magnetically connect the display of the apparatus to one or more displays of another apparatus or hingedly connect the display of the apparatus to one or more displays of another apparatus.

11. An apparatus as claimed in claim 1, wherein the display is a foldable display comprising a first portion and a second portion such that an angle between the first portion and the second portion is changeable.

12. A method comprising:
modulating or modifying a light output with one or more light sources, wherein the light output is for use in rendering content in a first direction using a display, wherein the display has at least one curved portion, wherein the modulating or modifying of the light output with the one or more light sources modulates or modifies said light within said at least one curved portion such that said content is rendered in the first direction within said curved portion.

13. A method as claimed in claim 12, wherein at least one of said at least one curved portion is at a periphery of the display, wherein the modulating or modifying of the light output with the light source is such that said content is rendered in the first direction within the curved periphery of the display.

14. A method as claimed in claim 12, wherein modulating or modifying the light output with the one or more light sources comprises attenuating light in directions other than the first direction.

15. A method as claimed in claim 12, further comprising increasing light intensity of the light output within the curved portion of the display to compensate for modulating or modifying the light output within the curved portion.

16. A non-transitory program storage device readable by an apparatus, tangibly embodying a program of instructions executable with the apparatus for performing operations, the operations comprising:
modulating or modifying a light output with one or more light sources, wherein the light output is for use in rendering content in a first direction using a display, wherein the display has at least one curved portion, wherein the modulating or modifying of the light output with the one or more light sources modulates or modifies said light within said at least one curved portion such that said content is rendered in the first direction within said curved portion.

\* \* \* \* \*